(12) United States Patent
Liebl et al.

(10) Patent No.: US 7,861,144 B2
(45) Date of Patent: *Dec. 28, 2010

(54) METHOD AND SYSTEM FOR ENCODING OR DECODING A SEQUENCE OF DIGITAL DATA

(75) Inventors: Günther Liebl, Freising (DE); Jürgen Pandel, Feldkirchen-Westerham (DE); Marcel Wagner, München (DE); Wenrong Weng, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 2 days.

This patent is subject to a terminal disclaimer.

(21) Appl. No.: 12/371,560

(22) Filed: Feb. 13, 2009

(65) Prior Publication Data

US 2009/0144602 A1  Jun. 4, 2009

Related U.S. Application Data

(63) Continuation of application No. 10/518,960, filed as application No. PCT/DE03/01953 on Jun. 12, 2003, now abandoned.

(30) Foreign Application Priority Data

Jun. 18, 2002  (DE) ................... 102 27 165

(51) Int. Cl.
*H03M 13/00* (2006.01)
(52) U.S. Cl. .............. 714/776; 714/779; 714/774
(58) Field of Classification Search ............ 714/779, 714/774, 776
See application file for complete search history.

(56) References Cited

U.S. PATENT DOCUMENTS

| | | | | |
|---|---|---|---|---|
| 4,058,672 A | * | 11/1977 | Crager et al. ............ 370/394 |
| 4,058,838 A | * | 11/1977 | Crager et al. ............ 358/425 |
| RE31,182 E | * | 3/1983 | Crager et al. ............ 178/3 |
| 4,493,021 A | * | 1/1985 | Agrawal et al. .......... 709/236 |
| 5,200,864 A | * | 4/1993 | Dunn et al. .............. 360/48 |
| 5,274,772 A | * | 12/1993 | Dunn et al. .............. 710/11 |
| 5,335,328 A | * | 8/1994 | Dunn et al. .............. 710/33 |
| 5,384,669 A | * | 1/1995 | Dunn et al. .............. 360/48 |
| 5,414,570 A | * | 5/1995 | Fry et al. ................ 360/48 |

(Continued)

FOREIGN PATENT DOCUMENTS

DE  19614739  10/1997

(Continued)

OTHER PUBLICATIONS

XP-002242077—Rosenberg et al., "An RTP Payload Format for Reed Solomon Codes" Internet Engineering Task Force, Internet Draft (12 pages), Nov. 3, 1998.

(Continued)

*Primary Examiner*—Joseph D Torres
(74) *Attorney, Agent, or Firm*—King & Spalding L.L.P.

(57) ABSTRACT

A method is provided for encoding and decoding a sequence of digital data, according to which a portion of the sequence of digital data corresponds to a data block that includes several data packets, at least two data packets per data block containing an identifier. The position of the data packet within the corresponding data block can be determined based on the identifier, and the data is encoded or decoded by taking into account the identifier.

11 Claims, 6 Drawing Sheets

U.S. PATENT DOCUMENTS

| | | | | |
|---|---|---|---|---|
| 5,612,829 | A * | 3/1997 | Takai et al. | 360/54 |
| 5,754,754 | A * | 5/1998 | Dudley et al. | 714/18 |
| 5,774,469 | A | 6/1998 | Wirkestrand | 370/473 |
| 5,805,762 | A * | 9/1998 | Boyce et al. | 386/68 |
| 5,859,853 | A * | 1/1999 | Carlson | 370/468 |
| 5,993,056 | A * | 11/1999 | Vaman et al. | 714/776 |
| 6,055,663 | A | 4/2000 | Vogel et al. | 714/752 |
| 6,061,365 | A * | 5/2000 | Yeung et al. | 370/470 |
| 6,115,325 | A * | 9/2000 | Chien et al. | 367/21 |
| 6,175,871 | B1 * | 1/2001 | Schuster et al. | 709/231 |
| 6,262,965 | B1 * | 7/2001 | Shimbo et al. | 369/275.3 |
| 6,366,959 | B1 * | 4/2002 | Sidhu et al. | 709/231 |
| 6,381,240 | B1 * | 4/2002 | Muto | 370/389 |
| 6,530,057 | B1 * | 3/2003 | Kimmitt | 714/758 |
| 6,567,421 | B2 * | 5/2003 | Takeda et al. | 370/468 |
| 6,577,646 | B2 * | 6/2003 | Takeda et al. | 370/468 |
| 6,587,477 | B1 * | 7/2003 | Takeda et al. | 370/468 |
| 6,680,944 | B1 * | 1/2004 | Lym et al. | 370/394 |
| 6,751,238 | B1 * | 6/2004 | Lipp et al. | 370/541 |
| 2002/0012343 | A1 * | 1/2002 | Holloway et al. | 370/389 |
| 2009/0144602 | A1 * | 6/2009 | Liebl et al. | 714/776 |

FOREIGN PATENT DOCUMENTS

| | | |
|---|---|---|
| DE | 19844140 | 7/2000 |
| EP | 0996292 | 4/2000 |

OTHER PUBLICATIONS

Perkins et al., "Effects of Interleaving on RTP Header Compression", IEEE INFOM 2000 (8 pages), 2000.

Duden Informatik, Dudenverlag 2001 (1 page), 2001.

Schuler "Design and Implementation of an Adaptive Error Control Protocol" GMD Research Series 1999 (24 pages), 1999.

Base et al., "Generic Erasure Protection with In-Band Signaling of Protection Profiles (Enhanced APC-1841)" ITU Telecommunication Standardization Sector, H323 (16 pages), Oct. 30, 2000.

Schulzrinne et al., "RTP: A Transport Protocol for Real-Time Applications" Internet Engineering Task Force (75 pages), Jan. 1, 1996.

Base et al., Generic Erasure Protection with In-Band Signaling of Protection Profiles (enhanced APC-1992) ITU Telecommunication Standardization Sector H323 (17 pages), Feb. 23, 2001.

"RTP Fixed Header Fields" Connected: An Internet Encyclopedia. Freesoft.org (2 pages), Mar. 28, 2002.

Base et al., "A Realistic Test-Scenario for Erasure-Resilient Multimedia Transmission over Wireless Networks using RTP" ITU—Telecommunication Standardization Sector H323 (8 pages), Oct. 30, 2000.

* cited by examiner

METHOD AND SYSTEM FOR ENCODING OR DECODING A SEQUENCE OF DIGITAL DATA

RELATED APPLICATION

This application is a Continuation of U.S. patent application Ser. No. 10/518,960 filed Dec. 20, 2004 now abandoned, which is a U.S. National Stage Application of International Application No. PCT/DE2003/001953 filed Jun. 12, 2003, which designates the United States of America, and claims priority to German Application No. DE 102 27 165.8 filed Jun. 18, 2002. The contents of these applications are incorporated herein in their entirety by this reference.

BACKGROUND OF THE INVENTION

A Real-time Transfer Protocol (RTP) that controls the encoding, transmission, and decoding of real-time data, such as audio and video data, is known from [1]. According to [1], an RTP header contains a 16-bit sequential number that is incremented with each RTP packet. The sequential number enables the recipient to detect any packet losses occurring during transmission and to order the packets in their correct sequence. For data security reasons, a random number is used as the initial value for the first data packet. According to [1], an RTP header contains an option to identify the limits of data blocks in the data stream by setting marker bits.

What are termed interleaver blocks, whereby the data is read in an encoding device row-by-row into a matrix and column-by-column from the matrix, are known from [2]. The entire interleaver block is reassembled in a decoding device before the data contained in the block is used.

The use of redundancy information (also: redundancy) on the basis of which transmission errors can be compensated is known from [3]. Before being transmitted over a faulty transmission channel, data being transmitted (content data) is hereby additionally provided with redundancy information generated, using known methods, from the data being transmitted. The content data is then sent to a recipient on the transmission channel along with the redundancy information. On the recipient's side, it then is possible to compensate transmission errors in such a way that the content data is reconstituted based on the redundancy information. Known error correction methods are employed for this (see [4]).

A method for the unequal error protection (UXP) of data whereby error protection is varied within a data block by assigning the data different amounts of redundancy information is described in [5]. According to [5], a number of the data packets in a data block is variable and is indicated in a separate data field in the UXP header assigned to each data packet.

The printed patent specification U.S. Pat. No. 6,055,663 describes a method via which an improved error-robust multiplexing process is made possible.

Some data packets are lost when data is transmitted on faulty channels. This is particularly disadvantageous when also involving the loss of data packets which each include a marker bit indicating the limit of the data block. In this case, before being decoded the data packets will have to remain buffered until their positions within the individual data blocks or, as the case may be, the limits of the various data blocks can be reconstituted.

The present invention is therefore directed toward making it easier to reconstitute the limits of the data blocks.

Accordingly, method is disclosed for encoding a sequence of digital data for achieving the above-referenced directive. A portion of the sequence of digital data corresponds to a data block and includes several data packets. The data packets contain an identifier based on which the position of the data packet within the associated data block is determined. Each of the data packets further includes information relating to the data block width. Furthermore, at least one data packet per data block contains the identifier and at least one further data packet contains the information relating to the data block width. The identifier and the information relating to the data block width are transmitted alternately, particularly according to a predefinable repetition pattern, in a data field. The data is encoded taking the identifier into consideration.

The present invention is furthermore directed toward a method for decoding a sequence of digital data. A portion of the sequence of digital data corresponds to a data block and includes several data packets. The data packets contain an identifier based on which the position of the data packet within the associated data block is determined. Each of the data packets further contains information relating to the data block width. Furthermore, at least one data packet per data block contains the identifier and at least one further data packet contains the information relating to the data block width. The identifier and the information relating to the data block width are transmitted alternately, particularly according to a predefinable repetition pattern, in a data field. The data is decoded taking the identifier into consideration.

An advantage of the present invention is that, via the identifier, the positions of the received data packets within the associated data block can be immediately determined at the beginning of data transmission and/or when data packets are lost. The effort and expense required for data buffering being substantially reduced, it is consequently also possible to run a real-time application; for example, video telephony or any other multimedia application. The buffer for the data, thus, also can be significantly reduced in size in the decoding device or even totally dispensed with. Owing to the fact that only a single data field is required for transmitting the identifier and the information relating to the data block width, the amount of data to be transmitted is not increased in spite of the two functionalities in a single data field.

A development of the present invention is that the sequence of digital data includes a sequence of progressively encoded data (progressive data), such as progressively encoded images or image data streams, with its also being possible for the progressive data to be image data. Progressive data is temporally staggered in terms of its degree of detail, meaning that the image, for instance, is initially transmitted with a coarse resolution so that, although the image can be represented, its details are largely unrecognizable. Image refinements are thereafter transmitted step-by-step so that the image's resolution constantly improves as transmission progresses further.

In an additional development of the present invention, the data block includes redundancy information. This enables an error correction method to correct data errors occurring during transmission and to reconstitute the data.

Another development of the present invention is that a beginning and an end of the data block are determined on the basis of the identifier of the data packets.

An additional development of the present invention is that the number of data packets containing an identifier is predefined in such a way that every n-th data packet receives the identifier.

Another development of the present invention is that the number of data packets containing an identifier is predefined in such a way that the data field of every n-th data packet contains the identifier and some of the remaining data packets each contain the data block width in their data field.

In another development of the present invention, the predefinable number of data packets containing an identifier is every other data packet.

In an additional development of the present invention, the data block is an interleaver block. In the encoding device the data is hereby read, for example, row-by-row into the interleaver block and, for example, column-by-column from the interleaver block and then transmitted. If a data packet, which is to say a column of the interleaver block, is lost during data transmission, this data loss will be distributed over the rows of the interleaver block. If the data rows contain redundancy information, these errors can be corrected up to a certain number via an error correction method, with the amount of redundancy information directly influencing the number of errors that can be corrected.

An additional development of the present invention is that a sequence of the data blocks is identifiable, particularly based on a time stamp or a serial number. The time stamp is a digital identifier indicating, for example, the time at which an item of data, in this case the data block, was sent.

An additional development of the present invention is that the identifier for determining the position of the data packet within the data block is a sequential number. The sequential number is, for example, a serial number of the data packets. For data security reasons, a random number or a number "0" or "1" can be selected as the initial value.

In an additional development of the present invention, a Real-time Transfer Protocol (RTP) is used. RTP makes services available for transmitting real-time data, such as multimedia data. Such services include assigning time stamps and sequential numbers to data packets.

The sequential number of the RTP is used within the scope of the present invention to define the identifier for determining the position of the data packet within the data block.

An additional development of the present invention is that a method for unequal error protection, such as UXP, is used. Progressive data within a data block is hereby provided in each case, with a different amount of redundancy information in order to take into consideration the fact that the progressive data of a unit, such as an image, requiring to be represented, builds one set upon another, which is to say the different stages in the progression are to be taken into account in distributing the redundancy information. It is of practical advantage to provide a large amount of redundancy information at the beginning of the progressive data, while increasingly less redundancy information can be provided as the degree of detail increases. The number of data packets in a data block, what is termed the data block width, can vary per data block.

The length of the identifier preferably should be matched to that of the data field so that the same data field can be used for the identifier for determining the position of the data packet within the data block and for the data block width. If, for example, the data field for the data block width is 8 bits long and the identifier is determined from a 16-bit sequential number in the RTP header, then an 8-bit identifier can be generated from the 16-bit identifier by omitting the higher-value 8 bits.

A system for encoding a sequence of digital data is furthermore disclosed for achieving the present invention. Such arrangement provides for a processor unit embodied in such a way that a portion of the sequence of digital data is a data block and contains several data packets. The data packets contain an identifier based on which the position of the data packet within the associated data block can be determined. Each of the data packets further contains information relating to the data block width. Furthermore, at least one data packet per data block contains the identifier and at least one further data packet contains the information relating to the data block width. The identifier and the information relating to the data block width are transmitted alternately, particularly according to a predefinable repetition pattern, in a data field. The data is encodable taking the identifier into consideration.

A system for decoding a sequence of digital data is furthermore disclosed for achieving the present invention. Such arrangement provides for a processor unit embodied in such a way that a portion of the sequence of digital data is a data block and includes several data packets. The data packets contain an identifier based on which the position of the data packet within the associated data block can be determined. Each of the data packets further contains information relating to the data block width. Furthermore, at least one data packet per data block contains the identifier and at least one further data packet contains the information relating to the data block width. The identifier and the information relating to the data block width are transmitted alternately, particularly according to a predefinable repetition pattern, in a data field. The data is decodable taking the identifier into consideration.

Such systems are suitable in particular, for implementing the methods according to the present invention or one of their developments elucidated in the foregoing.

The present invention, or any development described in the foregoing, also can be implemented via a computer program product having a storage medium on which is stored a computer program that is capable of running on a computer and which carries out the present invention or development.

Additional features and advantages of the present invention are described in, and will be apparent from, the following Detailed Description of the Invention and the Figures.

DETAILED DESCRIPTION OF THE INVENTION

Figure 1:
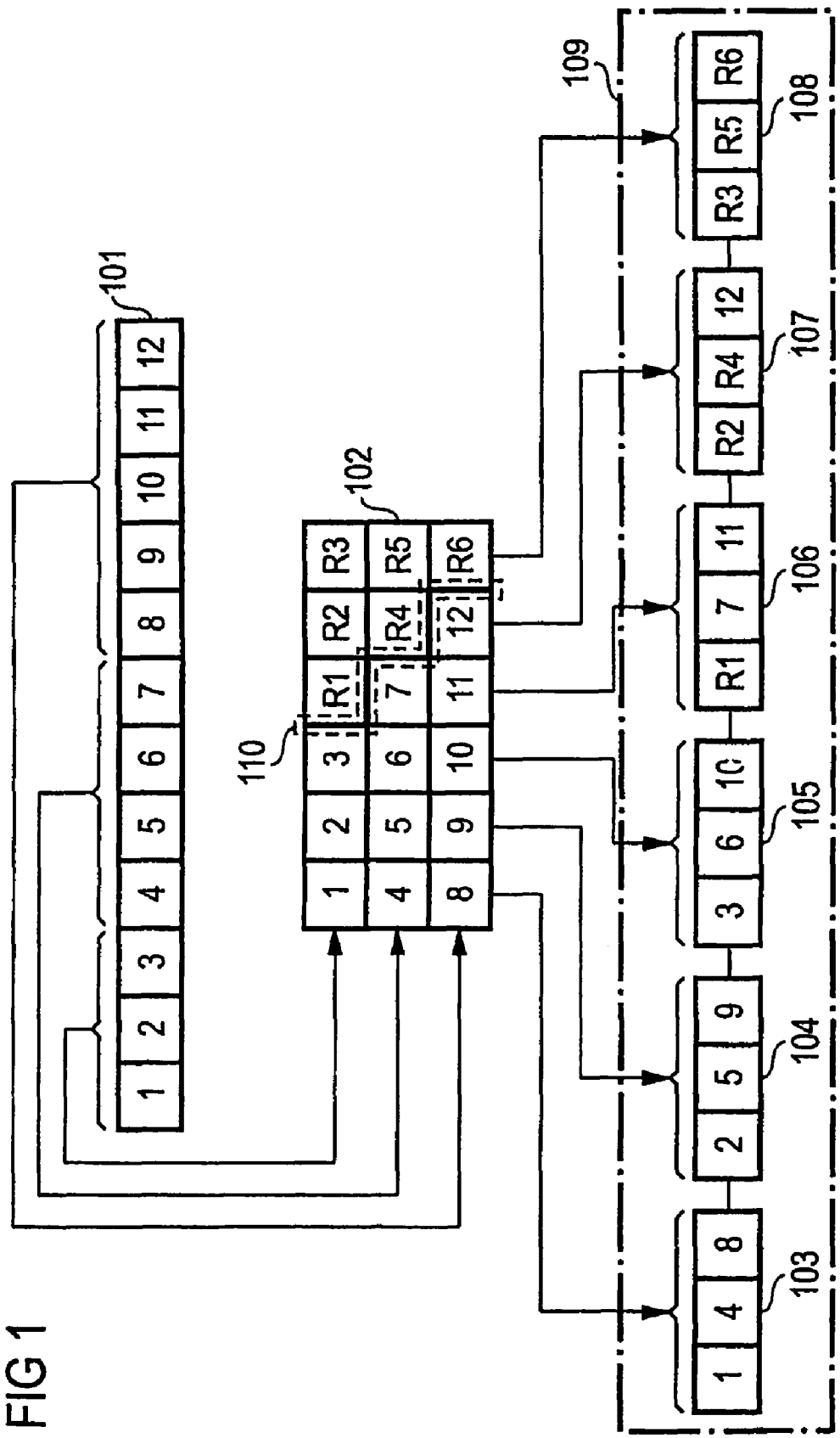
FIG. 1 is a sketch illustrating the principle of an interleaver block.

FIG. 1 is a sketch illustrating the principle of how an interleaver block functions.

A progressive digital data sequence 101 including data 1 to 12 has been divided by way of example into three refinement steps, with data 1 to 3 being the most important data, data 4 to 7 being less important and, finally, data 8 to 12 having in this example the least significance within the progressive data sequence 101.

An interleaver block 102 contains 3 rows and 6 columns. For each row in the interleaver block 102, the data of a refinement step is filed in the interleaver block 102 and redundancy information is generated for the respective data of a refinement step and co-filed in the interleaver block 102. In FIG. 1 the interleaver block contains three rows: Data 1 to 3 in the first row is provided with redundancy information R1, R2, and R3, data 4 to 7 in a second row is provided with redundancy information R4 and R5, and data 8 to 12 in a third row is provided with redundancy information R6. As such, data 1 to 3 in the first row of the interleaver block 102 can be reconstituted with the greatest probability (compared to the data in the respective other two rows) because the first row was assigned the largest amount of redundancy information.

This gives rise in the interleaver block 102 to a redundancy profile 110 ensuing from the described distribution of data 1 to 12 and from the generated redundancy information R1 to R6 within the interleaver block 102.

Data 1 to 12, along with redundancy information R1 to R6, is subsequently read out from the interleaver block 102 column-by-column, with the contents of the columns each being combined in a data packet 103 to 108: Data packet 103 includes data 1, 4, and 8, data packet 104 comprises data 2, 5, and 9, data packet 105 includes data 3, 6, and 10, data packet 106 includes redundancy information R1 and data 7 and 11, data packet 107 includes redundancy information R2 and R4 and data 12, and data packet 108 includes redundancy information R3, R5, and R6.

A read-out data sequence 109 is thus: {1, 4, 8}, {2, 5, 9}, {3, 6, 10}, {R1, 7, 11}, {R2, R4, 12}, {R3, R5, R6}.

Figure 2:
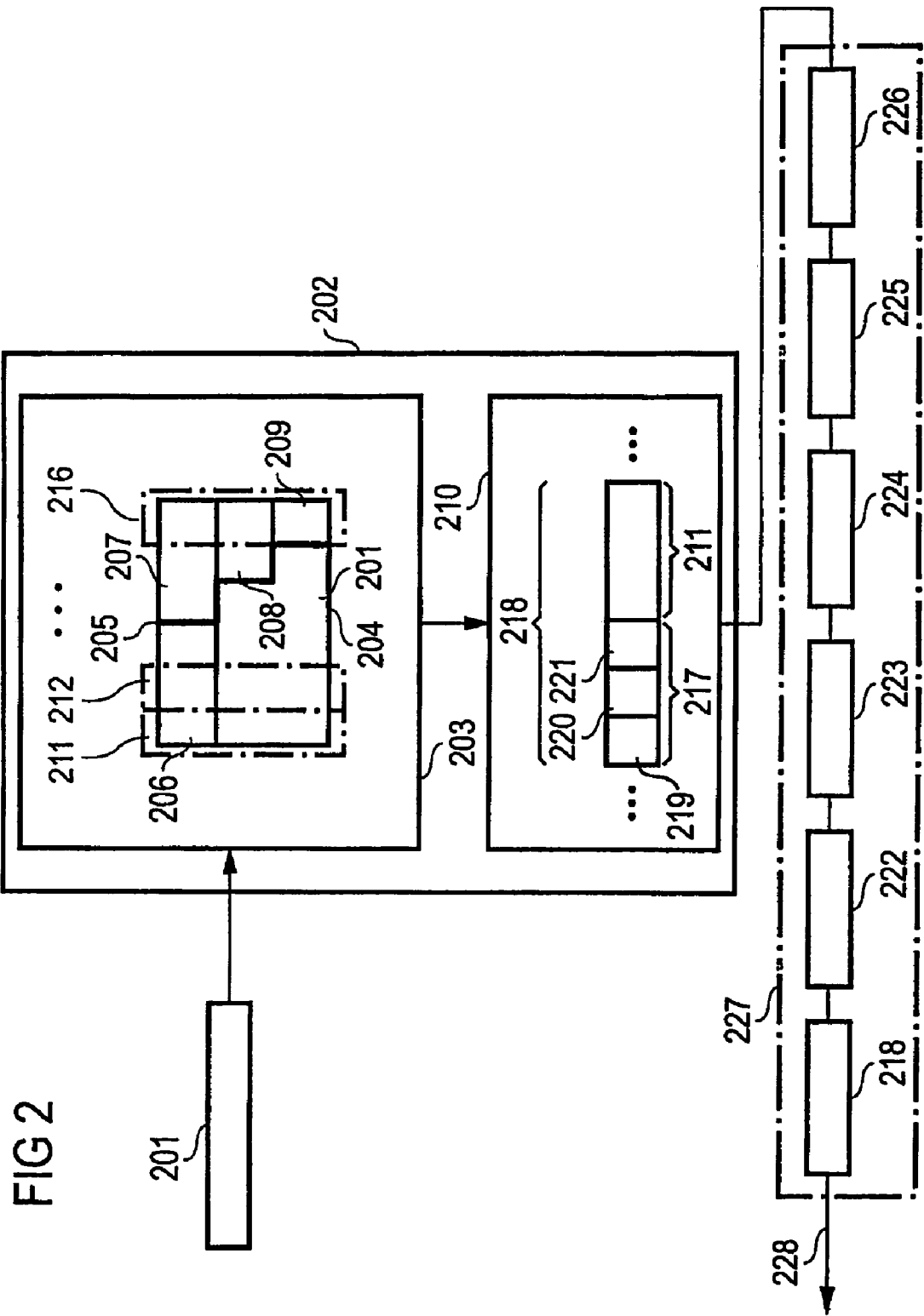
FIG. 2 is a sketch illustrating a method for encoding digital data.

FIG. 2 is a sketch illustrating a method for encoding digital data.

A sequence of progressive data 201, consisting here by way of example of a data block, is routed to an encoding unit 202 containing an optimizing unit 203 and a packing unit 210. The sequence 201 is first routed to the optimizing unit 203 and analyzed there. The analysis supplies a structure of the progression of the data on the basis of which are determined a length on an interleaver block 204 and a redundancy profile 205. The redundancy profile 205 belongs to the administrative data 206 required for evaluating the interleaver block 204 on the recipient's side. Redundancy information 207 for the administrative data 206 and redundancy information 208 and 209 for the digital data 201 is generated in the optimizing unit 203, it hereby being the case that the greater the amount is of redundancy information provided, the more important is the data, which is to say, inter alia, dependent on the refinement step of the progression (see the explanations above).

The administrative data 206 is first filed in the interleaver block 204 and the largest amount of redundancy information 207 assigned to the data so that, for instance, as many transmission errors as possible can be corrected. The interleaver block 204 is then filled row-by-row with the progressive data 201 and associated redundancy information 208 and 209.

When the interleaver block 204 has been filled with data and redundancy information, its contents will, as explained with the aid of FIG. 1, be read out column-by-column and routed to the packing unit 210. Packing of the contents of a column 211 of the interleaver block 204 is shown by way of example for the packing unit 210. The data packet 211 corresponding to the data in the column 211 hereby will be provided with a header 217 and combined into a data packet 218, referred to below as transmission packet 218.

The header 217 contains a field 219 which, in turn, contains a sequential number for transmission packet 218. The header 217 further contains a field 220 in which is alternately indicated an identifier on the basis of which the position of the data packet 211 within the respective interleaver block 204 can be determined and a width of the respective interleaver block 204. The header 217 furthermore contains a field 221 in which is indicated a time stamp for the respective interleaver block 204, with each interleaver block of an image sequence receiving a different value as the time stamp so that individual interleaver blocks are mutually distinguishable. It should be noted here that the sequence of digital data 201 contains several progressively encoded units, with it preferably being the case that one each of a unit of this kind is filed in the interleaver block. The interleaver blocks can vary in length depending on the progressively encoded unit. Individual images in the sequence of digital data 201 are preferably progressively encoded.

Analogously to column 211, the remaining columns 212 to 216 of the interleaver block 204 are packed into transmission packets 222 to 226 and transmitted along with transmission packet 218. This hereby produces an encoded data sequence 228 corresponding to a data block 227. The data block 227 is also referred to as a transmission block.

Figure 3:
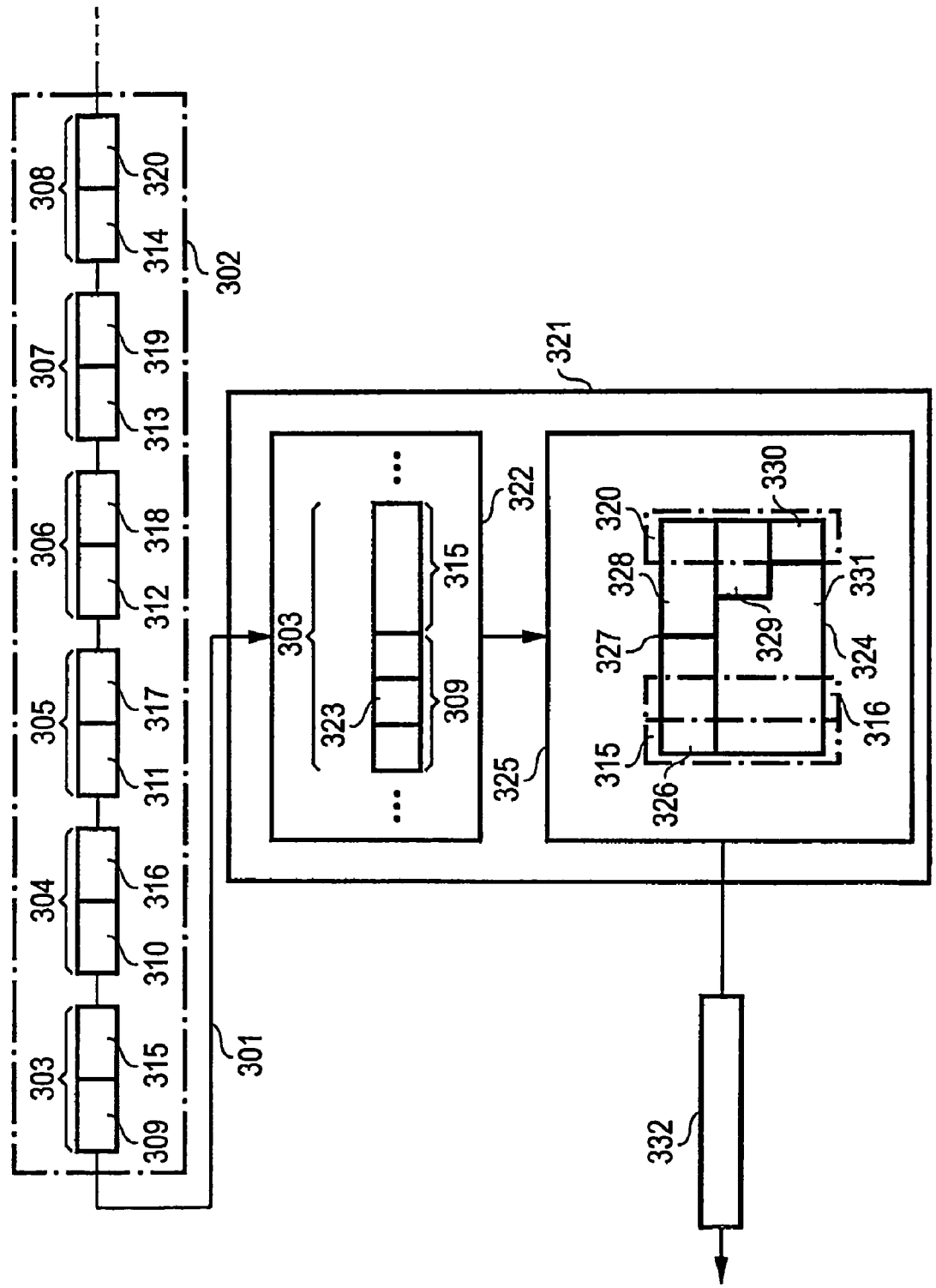
FIG. 3 is a sketch illustrating a method for decoding digital data.

FIG. 3 shows a method for decoding digital data.

A sequence of digital data 301 contains a data block 302 which, in turn, contains several transmission packets 303 to 308, with each transmission packet having a header and a data packet.

Transmission packet 303 thus contains a header 309 and a data packet 315, transmission packet 304 a header 310 and a data packet 316, transmission packet 305 a header 311 and a data packet 317, transmission packet 306 a header 312 and a data packet 318, transmission packet 307 a header 313 and a data packet 319, and transmission packet 308 a header 314 and a data packet 320. The sequence of digital data that was, in particular, received on a faulty transmission channel is routed to a decoding unit containing an unpacking unit 322 and an evaluation unit 325.

Transmission packets 303 to 308 are first routed to the unpacking unit 322 and data packets 315 to 320 are unpacked. Unpacking of data packet 315 from transmission packet 303 is shown by way of example for the unpacking unit 322. Thus, first the header 309 of transmission packet 303 is evaluated and, on the basis of the header 309, particularly on the basis of the identifier 323 contained therein, the column position of data packet 315 within an interleaver block 324 is determined. The problem of determining the position is explained in detail further below in FIG. 5.

Transmission packet 303 remains buffered in the unpacking unit 322 until the position of data packet 315 in the interleaver block 324 can be determined.

If it was possible to determine the position of data packet 315 within the interleaver block 324, the data packet 315 will be filed as the column in the interleaver block 324 of the evaluation unit 325. The interleaver block 324 is analogously filled column-by-column with data packets 316 to 320.

The contents of the interleaver block 324 are then evaluated row-by-row; for example, the image information is read out. Data 326 contains administrative information on the basis of which a redundancy profile 327 can be constructed for the interleaver block 324. The boundary between content information, whether this be of an administrative nature (see data 326) or pure image data (see data 331), is determined with the redundancy profile.

If data packets 315 to 320 of the interleaver block 324 have been lost owing, for example, to faulty transmission, the resulting errors can be corrected (up to a certain frequency whose upper limit is defined by the amount of redundancy information transmitted) in the evaluation unit 325 via an error correction method with the aid of redundancy information 328, 329, and 330, it here being the case that, for example, the loss (only) of data packet 316 means that a column of the interleaver block 324 has to be restored, which, in terms of the arrangement explained above of the redundancy information, can be done row-by-row, with it being possible owing, in particular, to the progression of the data, to ensure that important data in data packet 316 can be reconstituted and unimportant data, where applicable, dispensed with without jeopardizing the method's functioning capability. The read-out digital data sequence 332 can be further processed in an image decoder, in particular in a decoder operating according to an image compression standard such as, for example, MPEG1, MPEG2, MPEG4, H.261, H.263, or H.26L.

Figure 4:
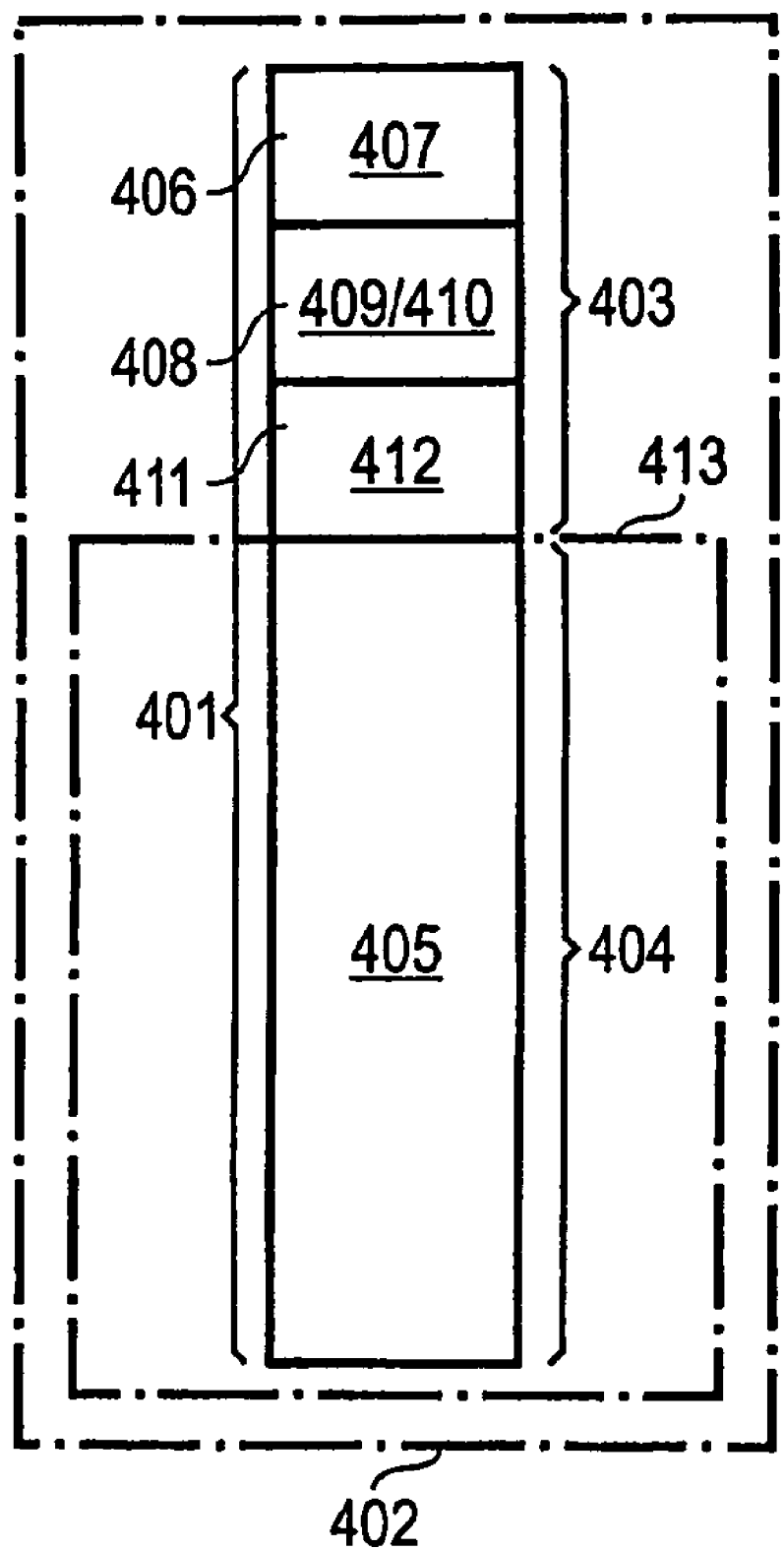
FIG. 4 shows the structure of a transmission packet.

FIG. 4 shows the structure of a transmission packet. A transmission packet 401 of a transmission block 402 contains a header 403 and a data field 404 which, in turn, contains a data packet 405. The header 403 contains a sequential number field 406 in which is indicated a sequential number 407 of transmission packet 401, a designation field 408 in which is indicated either an identifier 409 for determining the position of data packet 405 within data block 413 or a width 410 of transmission block 402, and a time stamp field 411 in which is indicated the value 412 of a time stamp of transmission block 402.

Figure 5:
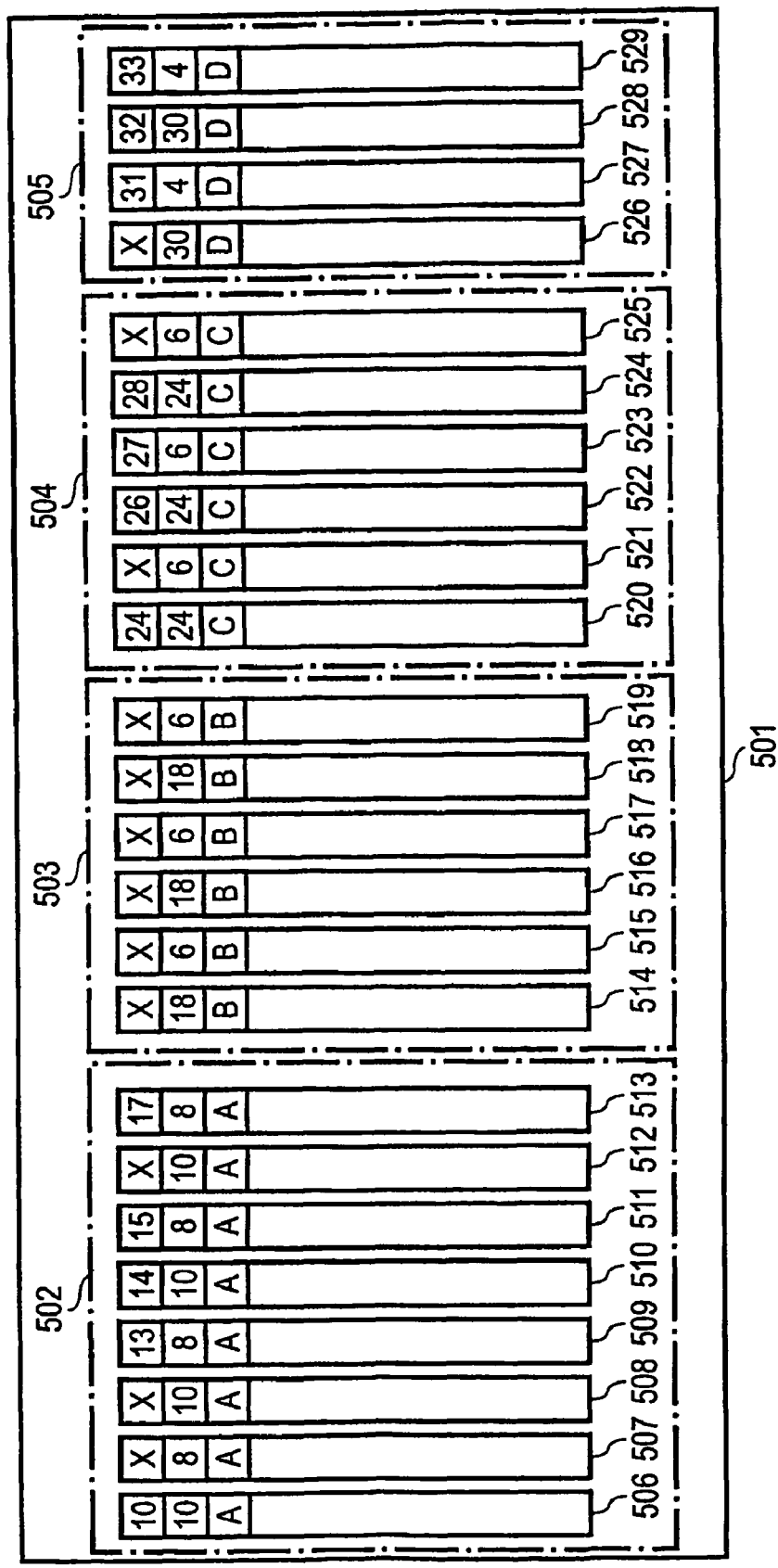
FIG. 5 shows an instance of determining the position of the data packets within data blocks.

FIG. 5 shows an instance of determining the position of the data packets within data blocks.

The explanations below proceed, using the terms employed in the preceding figures, from an instance of determining the position of transmission packets within the transmission blocks. The transmission block contains several transmission packets each having a header and a data packet (see description relating to FIG. 2). A data block, by contrast, is produced from the data packets of the respective block. The transmission block thus includes the transmission packets (see FIG. 4, 401), including their respective headers (see FIG. 4, 403). The information in the headers is essential for the position determining mentioned.

A data sequence 501 includes transmission blocks 502, 503, 504, and 505, with transmission block 502 containing transmission packets 506 to 513, transmission block 503 containing transmission packets 514 to 519, transmission block 504 containing transmission packets 520 to 525, and transmission block 505 containing transmission packets 526 to 529. The structure of each transmission packet is described in FIG. 4. Reference is therefore made to the description applying to FIG. 4 for the terms used for the individual fields.

Transmission packets 506 to 513 belonging to transmission block 502 are each designated in time stamp field 411 with a time stamp value "A," transmission packets 514 to 519 belonging to transmission block 503 are each designated in time stamp field 411 with a time stamp value "B," transmission packets 520 to 525 belonging to transmission block 504 are each designated in time stamp field 411 with a time stamp value "C," and transmission packets 526 to 529 belonging to transmission block 504 are each designated in time stamp field 411 with a time stamp value "D.". In their sequential number field 406, transmission packets 506 to 529 contain a serial sequential number 407, by way of example beginning with "10" for transmission packet 506 and ending with "33" for transmission packet 529.

In their respective designation field, transmission packets having an even sequential number 506, 508, 510, 512, 514, 516, 518, 520, 522, 524, 526, or 528 contain the identifier for determining the position of the transmission packet within the associated transmission blocks, with the identifier here consisting of the sequential number of the respectively first transmission packet in the transmission block, which is to say that in the designation field 408 transmission packets 506, 508, 510, and 512 contain the value "10," in the designation field 408 transmission packets 514, 516, and 518 contain the value "18," in the designation field 408 transmission packets 520, 522, and 524 contain the value "24," and in the designation field 408 transmission packets 526 and 528 contain the value "30." In the designation field 408, the transmission packets having an odd sequential number 507, 509, 511, 513, 515, 517, 519, 521, 523, 525, 527, or 529 contain the respective transmission block width 410, which is to say that in the designation field 408 transmission packets 507, 509, 511, and 513 contain the value "8" for the width of transmission block 502, in the designation field 408 transmission packets 515, 517, and 519 contain the value "6" for the width of transmission block 503, in the designation field 408 transmission packets 521, 523, and 525 contain the value "6" for the width of transmission block 504, and in the designation field 408 transmission packets 527 and 529 contain the value "4" for the width of transmission block 505.

In FIG. 5 it is assumed that transmission packets 507, 508, and 512 of transmission block 502, transmission packets 514 to 519, which is to say the entire transmission block 503, transmission packets 521 and 525 of transmission block 504, and transmission packet 526 of transmission block 505 have been lost during data transmission. Lost transmission packets are designated in FIG. 5 by an "X" in the respective sequential number field.

Since the last transmission packet 519 of transmission block 503 was not received and since transmission blocks 502 to 505 have different transmission block widths, the start of transmission block 504 cannot be determined from the change in time stamp value from "B" to "C" because either transmission packet 520 or one of transmission packets 514 to 519 could be the first transmission packet in transmission block 504. As the boundary between transmission block 503 and transmission block 504 cannot be uniquely identified, without the above-described identifier the received transmission packets 520, 522, 523, and 524 cannot be uniquely assigned their position within transmission block 504. If the last transmission packet 525 of transmission block 504 and the first transmission packet 526 of transmission block 505 have also been lost, without an identifier it is not possible, either, to uniquely identify the end of transmission block 504 from the change in time stamp value from "C" to "D," thus making it necessary to buffer more than one transmission block before the data can be decoded.

It is now possible, via the identifier in the designation field, to mutually compare the sequential number "24" and the identifier "24" on receipt of transmission packet 520, from which it follows that this is the first transmission packet of transmission block 504 as the identifier "24" tallies with the sequential number "24." Consequently, the received transmission packets 520, 522, 523, and 524 of transmission block 504 can be filed directly at the correct positions within the transmission blocks 504 and it is not necessary to buffer the transmission packets for a longer period. If transmission packet 520 having the sequential number "24" is lost as well, then from the identifier "24" of the received transmission packet 522 having the sequential number "26" it will be possible immediately to calculate the position of such transmission packet in transmission block 504: 26−24=2, which is to say there are two transmission packets 520 and 521 in transmission block 504, so the received transmission packet 522 is the third transmission packet of transmission block 504. Further buffering of transmission packets of the transmission block concerned is not necessary in this case either.

In FIG. 5, the sequential number of the first transmission packet in the respective transmission block has been selected as the identifier. Further possibilities are to use the distance from either the first or last transmission packet in the respective transmission block as the identifier. As a further exemplary embodiment, the 8-bit data field is used for the transmission block width from UXP to alternately indicate the transmission block width and the identifier in the transmission packets. The identifier is determined from the 16-bit sequential number of the RTP by reducing the sequential number of the first transmission packet of the respective transmission block from 16 to 8 bits. This is achieved, for instance, by deleting the higher-value places in the hexadecimal code, thereby reducing this, for example, from 0xDC36 to 0x36.

Figure 6:
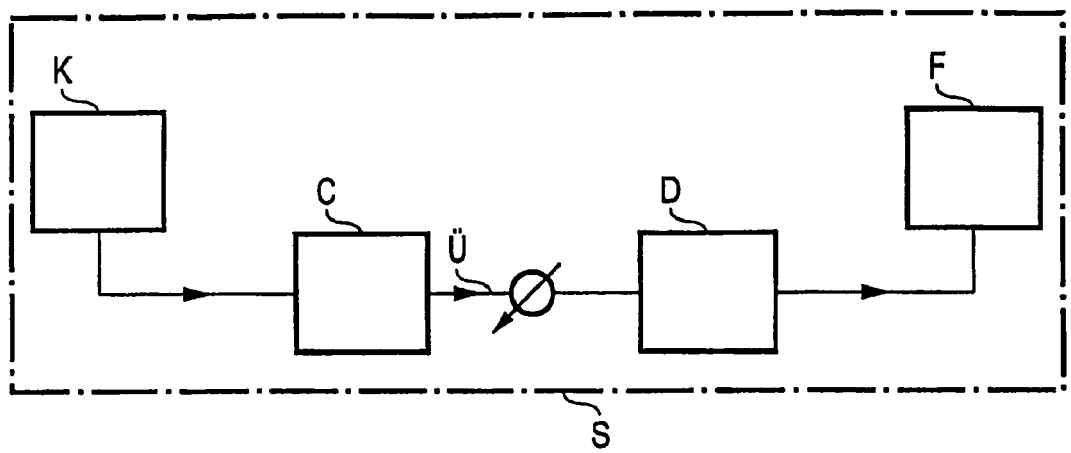
FIG. 6 shows the structure of a transmission system.

FIG. 6 shows the structure of a transmission system S. The transmission system S contains a camera K, an encoder C, a faulty transmission channel Ü, a decoder D, and a display device F. Image data generated by the camera K is encoded in the encoder C, transmitted on the malfunctioning transmission channel Ü, decoded by the decoder D, and displayed by the display device F. The encoder C and/or decoder D operate(s), in particular, in conformity with an image compression standard such as, for example, MPEG1, MPEG2, MPEG4, H.261, H.263, or H.26L. The encoder and/or decoder operate(s), in particular, taking the method according to the present invention into consideration.

Figure 7:
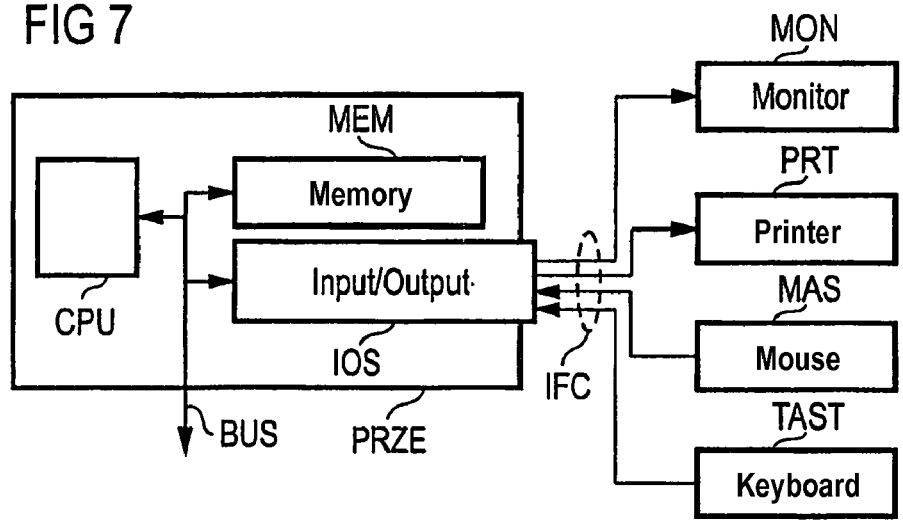
FIG. 7 shows a processor unit.

FIG. 7 shows a processor unit PRZE. The processor unit PRZE contains a processor CPU, a memory MEM, and an input/output interface IOS is used in a variety of ways via an interface IFC. An output is visualized on a monitor MON and/or fed out on a printer PRT via a graphic interface. Inputs are made via a mouse MAS or a keyboard TAST. The processor unit PRZE also has a data bus BUS providing the connection of a memory MEM, the processor CPU, and the input/output interface IOS. Additional components such as, for example, an additional memory, data storage medium (hard disk), or scanner furthermore can be connected to the data bus BUS.

Although the present invention has been described with reference to specific embodiments, those of skill in the art will recognize that changes may be made thereto without departing from the spirit and scope of the present invention as set forth in the hereafter appended claims.

REFERENCES

[1] H. Schulzrinne, S. Casner, R. Frederick, V. Jacobson: "RTP: A Transport Protocol for Real Time Applications", Chapter 5.1, RFC 1889, Internet Engineering Task Force, January 1996 (internet address as at Mar. 28, 2002: http://www.freesoft.org/CIE/RFC/1889)
[2] A. Falkenberg: "Kodier-/Dekodiervorrichtung zum Durchführen eines Block-Interleaving/Deinterleaving" (meaning: Encoding/decoding device for performing block interleaving/de-interleaving), Patent Specification DE 198 44 140 C1
[3] Duden Informatik, p. 553, Dudenverlag 2001
[4] C. Schuler: "Design and Implementation of an Adaptive Error Control Protocol", Chapter 2.1, GMD Research Series; 1999, No. 21 (internet address as at Apr. 25, 2002: http://www.gmd.de/publications/research/1999/021/)
[5] G. Bäse, G. Liebl: "Generic erasure protection with inband signaling of protection profiles", ITU Telecommunication Standardization Sector, H.323 Annex I, November 2000 (internet address as at Apr. 8, 2002: http://standards.pictel.com/ftp/avcsite/till_0012/0011_Gen/APC-1992.zip)

What is claimed is:

1. A method for receiving a sequence of digital data, the method comprising:
receiving a data block of the sequence of digital data, the data block comprising transmission packets, each transmission packet having one of two headers and a data packet, the two headers being alternated between the transmission packets within the data block, wherein the first header of the two headers comprises a sequential number of the transmission packet and an identifier determining a position of the transmission packet within the data block, and the second header of the two headers comprises the sequential number of the transmission packet and a width of the data block;
unpacking the data packets corresponding to the data block; and
reading out digital data corresponding to the data block of the received sequence of digital data.

2. The method according to claim 1, wherein the method further comprises the following two steps after unpacking the data packets:
evaluating an interleaver block row-by-row to detect any data loss; and
restoring within the interleaver block any data loss by restoring transmission packets based on the sequential number of the transmission packet and either the identifier determining the position of the transmission packet within the data block or width of the data block in the alternated headers.

3. The method according to claim 1, wherein the sequence of digital data contains a sequence of digital image data or a sequence of progressive data.

4. The method according to claim 1, wherein the data block contains redundancy information.

5. The method according to claim 1, wherein a start and an end of the data block are determined via the sequential number of the transmission packet and either the identifier determining the position of the transmission packet within the data block or width of the data block in the alternated headers.

6. The method according to claim 1, wherein the identifier determining the position of the transmission packets within the data block is the sequential number of the transmission packet which is first in the data block.

7. The method according to claim 1, wherein a Real-Time Transfer Protocol is used as transmission protocol for receiving the sequence of digital data.

8. The method according to claim 7, wherein the sequential number of the transmission packets is determined from the first sequential number of the Real-Time Transfer Protocol used.

9. The method according to claim 1, wherein an unequal error protection method is used.

10. The method according to claim 9, wherein the unequal error protection method used is a UXP method.

11. A tangible computer readable storage medium storing computer program instructions which when executed on a programmable processor perform the steps of:
receiving a data block of the sequence of digital data, the data block comprising transmission packets, each transmission packet having one of two headers and a data packet, the two headers being alternated between the transmission packets within the data block, wherein the first header of the two headers comprises a sequential number of the transmission packet and an identifier determining a position of the transmission packet within the data block, and the second header of the two headers comprises the sequential number of the transmission packet and a width of the data block;
unpacking the data packets corresponding to the data block; and
reading out digital data corresponding to the data block of the received sequence of digital data.

* * * * *